United States Patent [19]

Ogawa et al.

[11] 4,051,382
[45] Sept. 27, 1977

[54] ACTIVATED GAS REACTION APPARATUS

[75] Inventors: Kazuyuki Ogawa; Masahiko Hirose, both of Yokohama; Masaaki Yada, Kawasaki; Hitoshi Imamura, Yokohama, all of Japan

[73] Assignee: Tokyo Shibaura Electric Co., Ltd., Kawasaki, Japan

[21] Appl. No.: 705,695

[22] Filed: July 15, 1976

[30] Foreign Application Priority Data

July 18, 1975 Japan .................................. 50-87236

[51] Int. Cl.$^2$ ............................................. B01K 1/00
[52] U.S. Cl. ....................................................... 250/531
[58] Field of Search ............................. 204/164, 192 E; 250/531, 547; 219/121 P

[56] References Cited

U.S. PATENT DOCUMENTS

| | | | |
|---|---|---|---|
| 3,485,591 | 12/1969 | Evans et al. | 23/208 |
| 3,547,802 | 12/1970 | Gleit et al. | 250/531 |
| 3,723,290 | 3/1973 | Hamblyn et al. | 250/547 |

*Primary Examiner*—John H. Mack
*Assistant Examiner*—Aaron Weisstuch
*Attorney, Agent, or Firm*—Oblon, Fisher, Spivak, McClelland & Maier

[57] ABSTRACT

A gas reaction apparatus has an activation chamber, a heat exchanger and a reaction chamber. A gas is introduced into the activation chamber and activated there by electric discharge. The activated gas is then cooled by the heat exchanger in case a reaction to be effected in the reaction chamber is exothermic or heated by the exchanger in case a reaction to be effected in the reaction chamber is endothermic. The heat resulting from the reaction with the gas can therefore be effectively removed so that a desired reaction is rapidly conducted in the reaction chamber without being followed by a side reaction.

7 Claims, 3 Drawing Figures

ACTIVATED GAS REACTION APPARATUS

This invention relates to a gas reaction apparatus, and more particularly to a gas reaction apparatus of the type for activating a gas reactant by electric discharge and causing a reaction of the gas reactant with other reactants with high efficiency.

Recently, in the manufacture of a semiconductor device, removal of a photo resist film used as an etching mask from a semiconductor element, or etching of, for example, a silicon substrate, has come to be carried out by using a gas plasma technique. This technique includes the technique of producing by D.C. or R.F. discharge a gas plasma containing therein ions, electrons, and active neutral species, i.e., free radicals. The free radicals in the gas plasma are allowed to contact a material to be treated, whereby a desired reaction is effected.

The characterizing feature of the above gas plasma technique resides in that the impartation of activation energy which, in the case of ordinary chemical reactions, is thermally effected, is electrically conducted. Namely, a gas reactant is excited by collision of electrons accelerated by electric discharge and is not required to be heated from outside. Accordingly, the reaction starts at ambient temperature. Such gas plasma techniques can be generally used for reaction of a gas with another kind of gas or a non-gaseous material.

Conventional apparatus based on the abovementioned gas plasma technique are for the most part constructed such that plasma production or gas activation, and reaction are effected in the same place. For example, U.S. Pat. No. 3,616,461 discloses a gas reaction apparatus comprised of a reaction chamber where a specified reaction is effected and an R.F. coil surrounding the reaction chamber. A material to be treated is placed within the reaction chamber. Upon operating the apparatus, while the reaction chamber is being evacuated, a gas is introduced thereinto, and radiofrequency power is applied to R.F. coil to cause production of a gas plasma. The active species in the plasma are reacted with the material to be treated.

The reaction based on the utilization of the gas plasma is said to be characterized in that it proceeds without being substantially accompanied by temperature rise or temperature fall irrespective of whether or not is is exothermic or endothermic, namely, in that it is an ambient temperature reaction. The reasons are as follows. Generally, in the conventional gas reaction apparatus, R.F. power having a frequency of about 13.5 MHz is used and simultaneously a low gas pressure of 1 torr or less is used for stabilization of the discharge. Under this condition, the degree to which the free radicals in the resultant gas plasma are activated is low (although it is not clear whether or not said activation degree is quantitatively low, or is qualitatively low) and accordingly the reaction rate is also low. Namely, the reaction of material A with material B proceeds as follows:

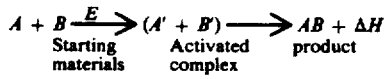

$$A + B \xrightarrow{E} (A' + B') \longrightarrow AB + \Delta H$$
Starting materials — Activated complex — product Since, as mentioned above, when using the conventional apparatus, the reaction rate is low, the effect of heat of reaction $\Delta H$ upon the reaction can be neglected although the heat of reaction $\Delta H$ is actually generated due to the nature of reaction itself, regardless of whether or not activation energy E is electrically or thermally supplied.

In recent years, however, highly activated gas has been obtained under a relatively high gas pressure by microwave discharge. The use of such a highly activated gas in a reaction causes it to proceed very speedily, and as a result the effect of reaction heat upon the reaction itself cannot be neglected. For example, according to the present inventors' experiments, when a piece of paper was placed in a flow of oxygen gas activated under conditions wherein the microwave power was 300 Watts; average gas pressure was 4 torr; and flow rate was $2 \times 10^3$ cm/sec, it started to ignite within a period of several seconds. Further, when a piece of copper was introduced into the same flow of oxygen gas, the surface thereof was covered with a black coating of CuO in about one second and was further heated to dark red. In such a heated condition, if impurities are contained in the activated gas, an undesirable side reaction will follow. Further, when a piece of lead was put in the above flow of oxygen gas and the surface thereof was observed, it was subject to color changes — yellow → brown → red → silver white, and was fused. This is considered to show that the lead (Pb) was changed into $PbO \rightarrow PbO_2 \rightarrow Pb_3O_4$ and then was subject to thermal decomposition and was returned to lead. It will be understood from this experiment that where it is desired to obtain an oxide of lead, a rise in temperature is disadvantageous.

The above is an example of an exothermic reaction. Since a method of using a microwave discharge technique as a gas activation means regardless of the type of reaction was developed, the concept that reactions based on the utilization of gas plasma techniques are ambient temperature reactions has collapsed and problems such as a decrease in reaction rate, occurrence of reverse reactions or side reactions, etc. due to the generation of a heat of reaction have arisen.

Accordingly, an object of the invention is to provide a gas reaction apparatus capable of effectively causing a desired reaction with respect to all the reactions in which an activated gas participates.

Another object of the invention is to provide a gas reaction apparatus capable of causing ambient temperature reaction by activating a gas reactant by electric discharge and in sequence contacting the gas reactant with another type of gas or a nongaseous material.

These and other objects which will be apparent from the following description have been attained by a gas reaction apparatus comprising an activation chamber having a gas inlet and outlet, first means for introducing a gas into the activation chamber through the inlet, second means for activating the gas in the activation chamber by electric discharge, a reaction chamber for causing a reaction with the gas, and third means for changing the temperature of the activated gas produced in the second means so that at least part of the heat resulting from the reaction with the gas may be removed, and means for introducing the gas into the reaction chamber.

The present invention will be more fully understood from the following detailed description when taken in conjunction with reference to the accompanying drawings in which.

Figure 1:
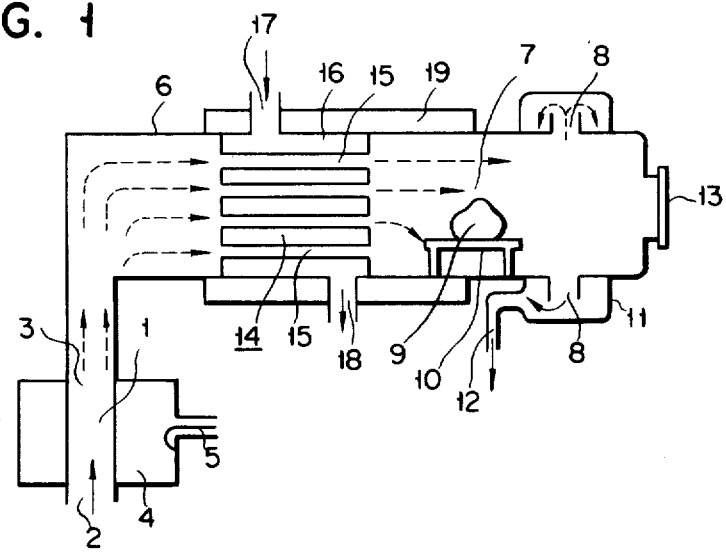
FIG. 1 is a schematic view of a gas reaction apparatus according to an embodiment of the invention.

This invention is based on the following knowledge. An activation chamber for activating a gas by electric discharge and a reaction chamber for causing a reaction with the gas are separately provided, and the temperature of the gas activated in the activation chamber is so changed that at least part of a positive or negative reaction heat may be neutralized. Namely if the reaction is exothermic, the activated gas is cooled, whereas if the reaction is endothermic the activated gas is heated. If, then, the resulting activated gas is introduced into the reaction chamber and reacted, the desired reaction is rapidly conducted in the reaction chamber at a relatively low temperature (nearly at ambient temperature) without being followed by or accompanied by a side reaction.

This invention will now be explained by reference to the accompanying drawing. Throughout the Figures, the same parts and sections are denoted by the same reference numerals.

As shown in FIG. 1, the gas reaction apparatus of the invention is provided with a quartz cylindrical activation chamber 1 having a gas inlet 2 and a gas outlet 3. An annular microwave cavity 4 is provided surrounding the activation chamber 1, into which is inserted an antenna 5 connected to a microwave source (not shown).

To the gas outlet 3 of the activation chamber 1 is connected a quartz cylinder 6 whose diameter is larger than that of the activation chamber 1. The forward portion of the cylinder 6 in the direction of gas stream forms a reaction chamber 7 having gas outlets 8, 8 and within this chamber a material 9 to be treated is placed on support 10. An annular hollow body 11 constituting a gas exhaust passage is provided surrounding the gas outlets 8, 8. This body 11 has a gas outlet 12. At a forward end of the reaction chamber 7 window 13 for observing and measuring the reaction conditions is provided. Adjacent the reaction chamber 7 a multi-piped heat exchanger 14 is provided wherein a number of metal pipes 15 are disposed in parallel longitudinally of the cylinder 6; around each of the metal pipes 15 a flow path 16 is provided for permitting flow therethrough of a medium for causing heat exchange between itself and the gas. The medium is introduced from inlet 17 and is exhausted from outlet 18. A heat insulation material 19 is provided around the heat exchanger 14.

Upon operating the apparatus, it is continuously evacuated from outlet 12 by means of a pump (not shown) and a gas, for example, oxygen, is introduced from inlet 2, whereby the apparatus interior is kept at a pressure of 4 torr. Under this condition, microwave power is fed to the antenna 5 to produce a microwave field in the microwave cavity 4. This microwave field is applied to the gas within the activation chamber 1 and as a result the gas is highly activated. The activated gas is carried into the heat exchanger 14, and during passage through the metal pipe 15 is subject, through the pipe wall, to heat exchange between itself and the medium flowing through the flow path 16, whereby the temperature of the activated gas is so changed that at least part of a positive or negative reaction heat $\Delta H$ resulting from the reaction with the material 9 to be treated within the reaction chamber 7 may be neutralized. Namely, the activated gas is cooled to a desired temperature using a cooling medium if the reaction within the reaction chamber 7 is exothermic, whereas the activated gas is heated to a desired temperature using a heating medium if the reaction within the reaction chamber is endothermic.

The gas cooled or heated by the above described heat exchanger 14 in accordance with the positive or negative sign of the reaction heat ($\Delta H$) is fed into the reaction chamber 7 and allowed to react with the material 9 to be treated. Since the reaction heat resulting from this reaction is removed by the activated gas, however high the degree of gas activation may be, the reaction is rapidly conducted as a whole at a relatively low ambient temperature.

The gas reaction apparatus of the invention can be used to remove a photo-resist from a semiconductor element by use of oxygen gas, to form a silicon nitride film used as a diffusion mask on a silicon substrate by use of nitrogen gas, or to carry out various types of reductions by use of hydrogen gas.

Needless to say, at least the face of the member constituting the heat exchanger 14 and contacting the gas is inert with respect to the gas used, and is of high heat conductivity. It would be obvious to those skilled in the art what material should be employed as heat exchanger for a particular gas. When oxygen is used, the heat exchanger can be formed of aluminum, gold, platinum, molybdenum, tungsten, nickel, iron, AISI 304, metal oxide ceramic such as beryllium oxide or alumina, a mixture thereof, or a metal low in oxidation resistance but high in heat conductivity such as copper plated with gold or platinum. As is well known, the heat exchanger is so constructed that no difference in gas pressure is produced between the inlet side and outlet side.

Figure 2:
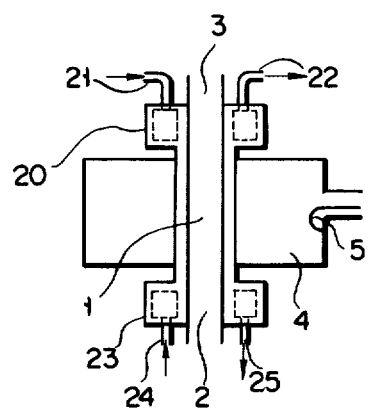
FIG. 2 is a schematic view showing part of the gas reaction apparatus according to another embodiment of the invention.

FIG. 2 shows a gas reaction apparatus wherein a gas activation field is provided close to the heat exchange field. The activation chamber 1 is formed of a dielectric material having a small radio frequency loss such as beryllium oxide, and the discharge chamber having the antenna 5 inserted thereinto is disposed surrounding that activation chamber. At the side of the gas inlet 2 of the activation chamber 1 a hollow ring 23 having a medium inlet 24 and a medium outlet 25 is provided. The activated gas is cooled or heated in a medium passing through the hollow rings 20 and 23.

Figure 3:
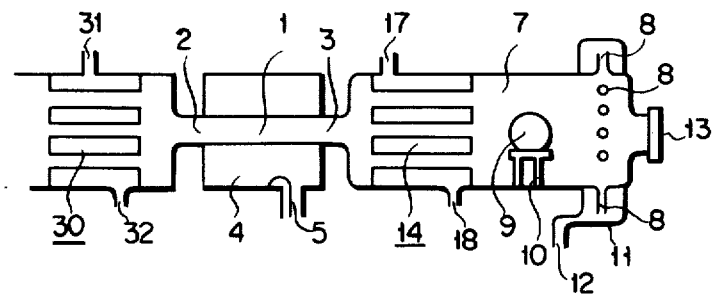
FIG. 3 is a schematic view of the gas reaction apparatus according to still another embodiment of the invention.

FIG. 3 shows a gas reaction apparatus similar to that shown in FIG. 1 provided at the gas inlet side of the activation chamber 1 thereof with a heat exchanger 30 having a medium inlet 31 and outlet 32, of the same construction as that of the heat exchanger 14. A gas to be activated is heated or cooled in advance of activation while passing through that heat exchanger 30. If, in any one of the above-mentioned embodiments, the material to be treated has a very good heat conductivity which permits a rapid transfer of the heat of its reaction phase, the reaction heat will be also removed with high efficiency by cooling or heating the sample support 10. As activation means, microwave discharge means are most preferable but, generally, a capacitance type or inductance type of high frequency discharge device can also be used.

What we claim is:

1. A gas reaction apparatus comprising:
an activation chamber having a gas inlet and outlet;

means for introducing a gas into the activation chamber through the inlet;

means for activating the gas in the activation chamber by electric discharge;

a reaction chamber positioned downstream of the activation chamber for providing a reaction with the gas;

means positioned between the activation chamber and the reaction chamber for changing the temperature of the activated gas supplied from the activating means and for introducing the gas into the reaction chamber.

2. A gas reaction apparatus according to claim 1 wherein the temperature changing means is a multi-piped heat exchanger comprising a plurality of metal pipes disposed in parallel and having a flow path provided around each of the metal pipes for permitting flow therethrough of a medium for causing heat exchange between the metal pipes and the gas.

3. A gas reaction apparatus according to claim 2 wherein the activating means comprises a microwave cavity surrounding the activation chamber, the microwave cavity having disposed therein an antenna for discharging microwaves into the discharge chamber.

4. A gas reaction apparatus according to claim 2 wherein the reaction in the reaction chamber is endothermic and the medium is a heating medium for heating the gas.

5. A gas reaction apparatus according to claim 2 wherein the reaction in the reaction chamber is exothermic and the medium is a cooling medium for cooling the gas.

6. A gas reaction apparatus according to claim 1 wherein the activation chamber is formed of dielectric material and is disposed at the gas inlet and outlet thereof respectively with the temperature changing means comprising hollow rings permitting passage therethrough of a medium for causing heat exchange between the hollow rings and the gas.

7. A gas reaction apparatus according to claim 2 further comprising at the gas inlet side of the activation chamber a multi-piped heat exchanger comprising a plurality of metal pipes disposed in parallel with a flow path provided around each of the metal pipes for permitting flow therethrough of a medium for causing heat exchange between the metal pipes and the gas.

* * * * *